(12) United States Patent
Amidi (10) Patent No.: US 9,846,468 B2
(45) Date of Patent: Dec. 19, 2017

(54) APPARATUS, SYSTEM, AND METHOD OF STORAGE AND RETRIEVAL OF LOCAL VOLATILE MEMORY CONTENT OF NON-VOLATILE STORAGE MEMORY

(71) Applicant: Xitore, Inc., Mission Viejo, CA (US)

(72) Inventor: Mike Hossein Amidi, Lake Forest, CA (US)

(73) Assignee: Xitore, Inc., Mission Viejo, CA (US)

( * ) Notice: Subject to any disclaimer, the term of this patent is extended or adjusted under 35 U.S.C. 154(b) by 0 days.

(21) Appl. No.: 15/192,244

(22) Filed: Jun. 24, 2016

(65) Prior Publication Data

US 2016/0378621 A1 Dec. 29, 2016

Related U.S. Application Data

(60) Provisional application No. 62/184,200, filed on Jun. 24, 2015.

(51) Int. Cl.
*G06F 1/30* (2006.01)
*G06F 11/16* (2006.01)
*G06F 3/06* (2006.01)
*G11C 11/00* (2006.01)

(52) U.S. Cl.
CPC .............. *G06F 1/30* (2013.01); *G06F 3/064* (2013.01); *G06F 3/0619* (2013.01); *G06F 3/0631* (2013.01); *G06F 3/0647* (2013.01); *G06F 3/0685* (2013.01); *G06F 11/1662* (2013.01); *G06F 2201/805* (2013.01); *G11C 11/005* (2013.01)

(58) Field of Classification Search
CPC ........ G06F 1/30; G06F 3/0685; G06F 3/0647; G06F 3/0619; G11C 11/005
See application file for complete search history.

(56) References Cited

U.S. PATENT DOCUMENTS

| | | | | |
|---|---|---|---|---|
| 7,395,452 B2 * | 7/2008 | Nicholson | ............... | G06F 1/30 711/E12.04 |
| 7,954,006 B1 * | 5/2011 | Mangipudi | ............... | G06F 1/30 713/340 |
| 8,566,639 B2 * | 10/2013 | Moshayedi | ........... | G11O 5/141 714/14 |
| 8,862,809 B2 * | 10/2014 | Zettsu | ................... | G06F 12/02 711/103 |
| 9,652,164 B2 * | 5/2017 | Rose | ..................... | G06F 3/0679 |

* cited by examiner

*Primary Examiner* — Vanthu Nguyen
(74) *Attorney, Agent, or Firm* — Fish IP Law, LLP (57) ABSTRACT

A system, method and apparatus to provide data recovery capabilities during an emergency power failure event. A non-volatile storage system is provided to be coupled with a host computer system. The non-volatile storage system includes an embedded non-volatile memory array for persistently storing data and an embedded volatile memory array for temporarily storing the data before committing the data to the non-volatile memory array. The non-volatile storage system provides a normal operating data path transferring data from the volatile memory array to the non-volatile memory array during normal operating condition. The normal operating data path includes data processing blocks. The non-volatile storage system also provides an emergency data path for transferring data from the volatile memory array to the non-volatile memory array during an emergency power loss condition. The emergency data path excludes the data processing blocks.

20 Claims, 11 Drawing Sheets

APPARATUS, SYSTEM, AND METHOD OF STORAGE AND RETRIEVAL OF LOCAL VOLATILE MEMORY CONTENT OF NON-VOLATILE STORAGE MEMORY

This application claims the benefit of priority to U.S. provisional application 62/184,200 filed on Jun. 24, 2015. This and all other extrinsic references referenced herein are incorporated by reference in their entirety.

FIELD OF THE INVENTION

The field of the invention is data recovery systems for memory devices

BACKGROUND

The background description includes information that may be useful in understanding the present invention. It is not an admission that any of the information provided herein is prior art or relevant to the presently claimed invention, or that any publication specifically or implicitly referenced is prior art.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

Computer systems, such as personal computers, servers, or clusters of computers, utilize non-volatile storage to store and retrieve data. Storing data in non-volatile storages allows the associated computer systems to access the data after power cycling and allows other computer systems to access the same data via a network.

Due to on-going demands for data storage units that can perform high speed storing and retrieval, data storage units on both consumer and enterprise levels have incorporated one or more internal volatile memory blocks to act as an intermediate storage for buffering before committing the data into the non-volatile memory units during storage cycle or for caching upon requests to retrieve data from non-volatile memory units into the host system during fetch cycles.

In order for a computer system to provide a robust, solid, secure, and deterministic operation, the non-volatile storage unit must guarantee the security and storage of internal volatile memory content during unpredicted, unscheduled power loss. If the non-volatile storage unit does not have a power back-up circuitry while the system experience unpredicted, unscheduled power loss, the content stored in the volatile memory within non-volatile storage unit will be lost and unrecoverable.

One solution is for non-volatile storage units to encompass a back-up power unit, such as a back-up battery or a back-up capacitor, for providing the required power to transfer the entire content stored in the volatile memory block within the non-volatile storage unit to the non-volatile storage elements.

Due to constant increasing demand of both consumer and enterprise non-volatile storage unit capacity today, the average non-volatile storage units has a capacity in the range of 4 to 8 terabytes (4,000,000,000,000-8,000,000,000,000 bytes). The internal volatile memory block size to effectively buffer or cache the required content capacity has a direct correlation to non-volatile storage units capacity. As the capacity of non-volatile storage units increases, the capacity of internal Volatile memory block will proportionally increase.

In order for the content stored in the volatile memory block to be safely and persistently saved in the non-volatile memory unit, the controller of the non-volatile memory unit need to complete the current ongoing operation, and then send the entire content stored in the volatile memory block through one or more internal blocks, such as a security block, a compression and Decompression block, an error correction circuitry (ECC) block, a scrambler and de-scrambler block, prior to storing the final processed content into the non-volatile memory array.

The larger the volatile memory block size, the higher power consumption is required to safely and permanently store the content stored in the volatile memory block in the non-volatile storage unit. The increase of power consumption translate to a larger battery or capacitor block to be incorporated into the non-volatile battery unit, which in turn requires large enough additional real state on the non-volatile storage unit, additional power requirements for charging and maintenance of the power holding blocks, additional thermal (i.e., heat dissipation) requirement for the large battery or super capacitor, and additional cost.

Thus, there remains a need for a system and method that improves the power consumption for non-volatile memory units to recover data during a power failure event.

SUMMARY OF THE INVENTION

The following description includes information that may be useful in understanding the present invention. It is not an admission that any of the information provided herein is prior art or relevant to the presently claimed invention, or that any publication specifically or implicitly referenced is prior art.

The inventive subject matter provides apparatus, systems, and methods to recover data during an emergency power failure event. In one embodiment where the volatile memory blocks content goes through a separate emergency power loss data path to be stored in non-volatile memory elements. In one embodiment, the content of volatile memory block is stored in a dedicated unique spare area in the non-volatile memory.

The content of previously stored volatile memory block content within the non-volatile storage unit elements has priority and will be the first task to be performed after a power cycle and while the power is fully restored to stable levels. The non-volatile storage controller will first fetch all previously stored volatile memory block content from the non-volatile storage unit elements via the normal operation data path. The normal operation data path includes one of more blocks such as a security block, a compression and decompression block, an error correction circuitry (ECC) block, a scrambler and de-scrambler blocks prior to storing the final content back to the non-volatile memory.

The inventive method, system and apparatus drastically reduce the latency of safely storing the content of the volatile memory block within the non-volatile storage controller during unpredictable, unscheduled power loss. They will also reduce the required power hold-up circuitry for either battery or super capacitor, will reduce overall required power, thermal, and cost of the non-volatile storage unit.

Various objects, features, aspects and advantages of the inventive subject matter will become more apparent from the following detailed description of preferred embodiments, along with the accompanying drawing figures in which like numerals represent like components.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

DETAILED DESCRIPTION

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously. As used herein, the term "operatively coupled to" refers to electronic components that are coupled with one another such that an electronic communication path exists between one electronic hardware component and another electronic hardware component.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be noted that any language directed to a computer system should be read to include any suitable combination of computing devices, including servers, interfaces, systems, databases, agents, peers, engines, controllers, or other types of computing devices operating individually or collectively. A "host" computer system is a functional computer system having a processor and motherboard to which a storage unit could be operatively coupled to in order to serve as a computer-readable medium for the computer system. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network. Computer software that is "programmed" with instructions is developed, compiled, and saved to a computer-readable non-transitory medium specifically to accomplish the tasks and functions set forth by the disclosure when executed by a computer processor.

The inventive subject matter provides apparatus, systems, and methods to provide fast and power efficient data recovery for data to be stored in a non-volatile storage unit. In some embodiments, the non-volatile storage system includes at least a volatile memory unit for buffering and caching data, a controller, and a non-volatile memory unit for persistently storing data in the non-volatile storage system. The non-volatile storage system also provides two separate data paths—a normal operating data path and an emergency power loss data path—for saving data that is temporarily stored in the volatile memory unit in the non-volatile memory unit.

The controller is configured to transfer the data that is temporarily stored in the volatile memory unit to the non-volatile memory unit through the normal operating data path under normal operating condition. The normal operating data path requires the data to go through one or more data processing blocks to generate processed data before committing the processed data to the non-volatile memory unit. However, when a power failure event is detected, the controller is configured to transmit the data that is temporarily stored in the volatile memory unit to the non-volatile memory unit through the emergency power loss data path. The emergency power loss data path allows the data to be directly transmitted to the non-volatile memory unit without going through the one or more data processing blocks in order to reduce latency and power consumption during the power failure event.

When the computing system is powered up after the power failure, the controller is configured to retrieve the unprocessed data from the non-volatile memory unit and temporarily store the unprocessed data in the volatile memory unit. The controller is then configured to transmit the data to the non-volatile memory unit via the normal operating data path so that the data will receive the proper processing before persistently saved in the non-volatile memory unit.

As used herein, a non-volatile storage system or non-volatile memory system is defined as an enclosed system for persistently storing data. The non-volatile storage system is configured to be directly communicatively coupled with a host system via a north/south bridge or a short range communication interface (e.g., USB connection, Bluetooth connection, etc.). A host system as used herein is defined as an electronic system that includes a motherboard. In some embodiments, the host system includes at least one processing unit (e.g., a processor, a processing core, etc.) and at least one volatile memory (e.g., dynamic random-access memory (DRAM), etc.) disposed on the motherboard, and the motherboard facilitates the communications between the processing unit, the volatile memory and other peripherals (such as the non-volatile storage system as disclosed herein, graphics card, etc.).

As used herein, a "north bridge" is a chip in the chipset of the motherboard that connects high speed buses, such as an FSB (front-side bus), a main memory bus, and/or a PCIe bus. As used herein a "south bridge" is another chip in the chipset of the motherboard that connects slower busses, such as a PCI bus, a USB (universal serial bus), and a SATA bus. The north bridge and the south bridge could be operationally coupled to one another using a DMI (direct media interface) bus.

Figure 1:
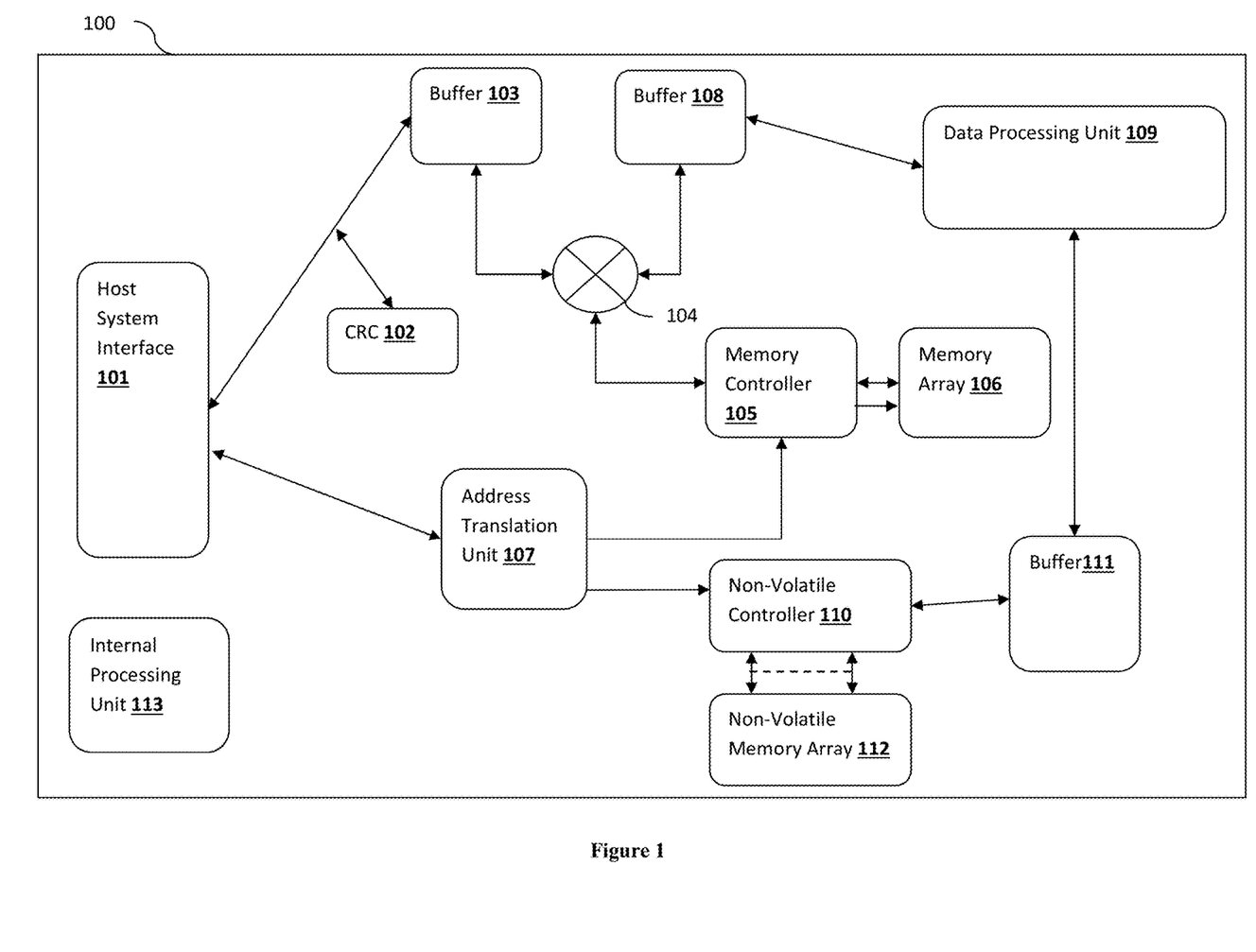
FIG. 1 is a schematic of a conventional non-volatile storage system.

FIG. 1 illustrates a schematic of a conventional non-volatile storage system 100. The non-volatile storage system 100 includes a host system interface 101 for communicating with a host system (not shown), a cyclic redundancy check (CRC) block 102, a buffer 103, a multiplexer/de-multiplexer 104, a volatile memory controller 105, a volatile memory array 106, an address translation unit 107, another buffer 108, a data processing unit 109 that may include different data processing blocks such as a security block, a compression engine, one or more error-correction units, data scrambler block, etc., a non-volatile controller 110, another buffer 111, a non-volatile memory array 112, and an internal processing unit(s) 113. All of these elements collectively form the conventional non-volatile storage system 100.

Figure 2:
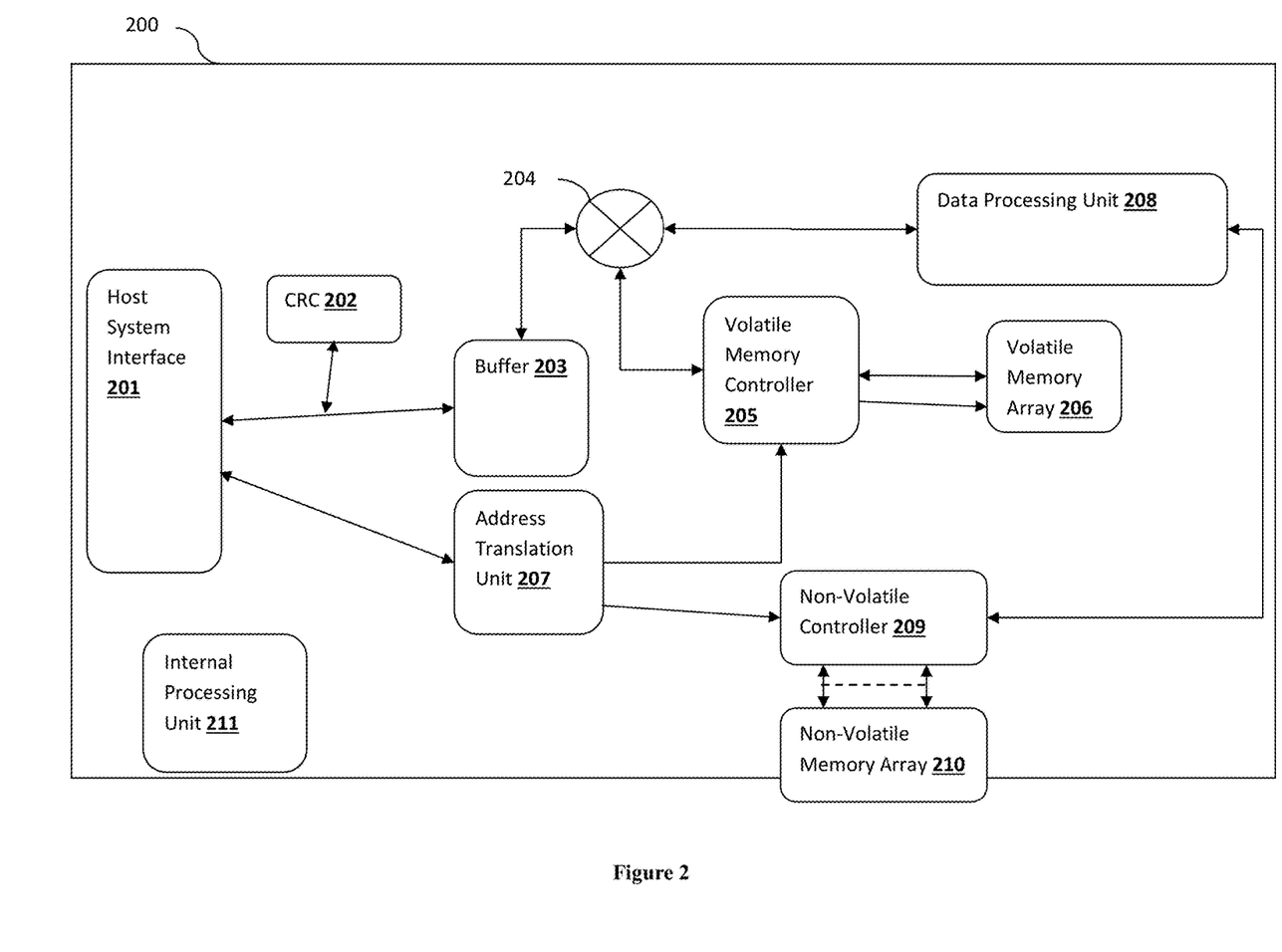
FIG. 2 is a schematic of another conventional non-volatile storage system.

FIG. 2 shows a schematic of another conventional non-volatile storage system 200. The non-volatile storage controller 200 includes a host system interface 201 for communication with a host system (not shown), a cyclic redundancy check (CRC) block 202, a buffer 203, a multiplexer/de-multiplexer 204, a volatile memory controller 205, a memory array 206, an address translation unit 207, a data processing unit 208 that may include different data processing blocks such as a security block, a compression engine, one or more error-correction units, data scrambler block, etc., a non-volatile memory controller 209, a non-volatile memory array 210, and an internal processing unit 211. All of these elements collectively form the conventional non-volatile storage system 200.

Figure 3:
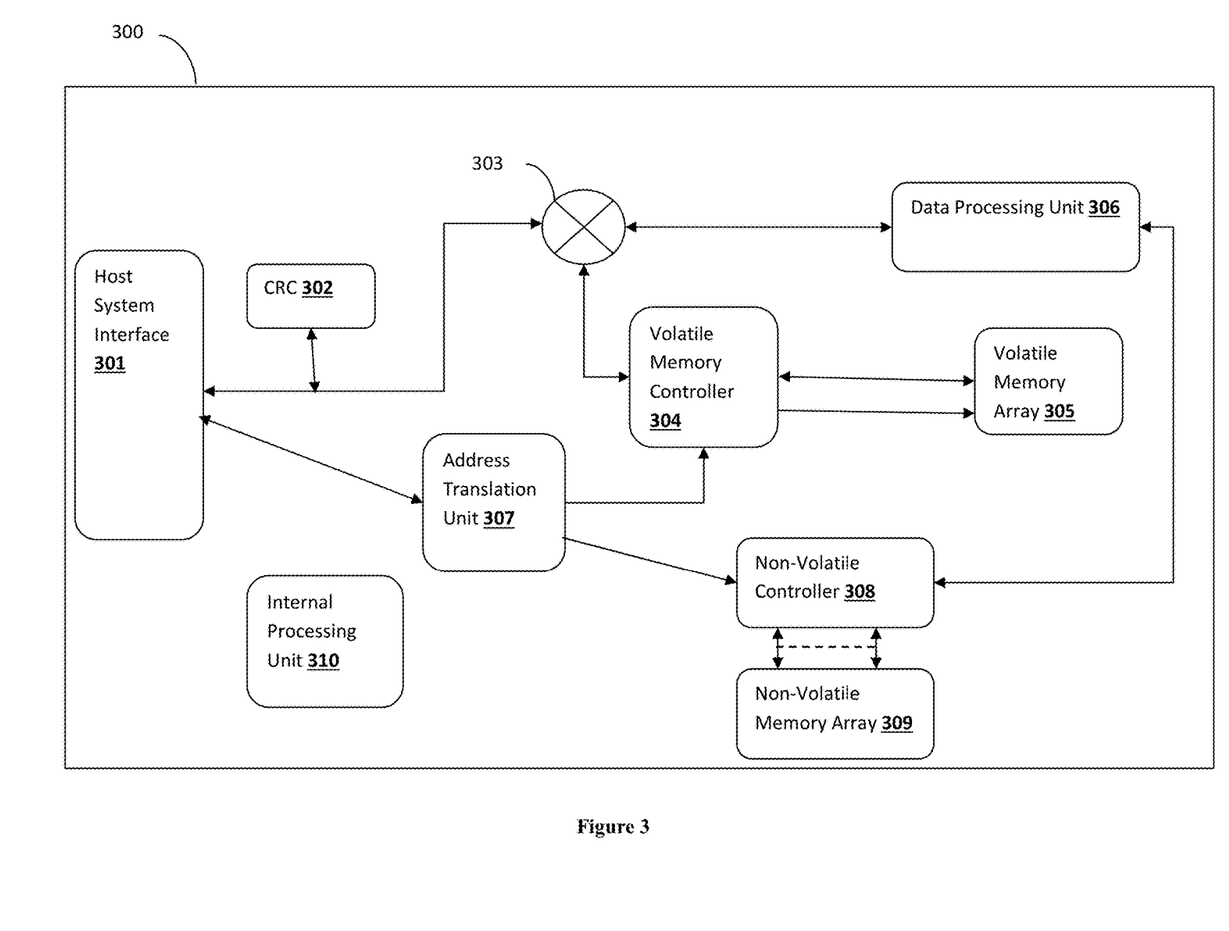
FIG. 3 is a schematic of yet another conventional non-volatile storage system.

FIG. 3 shows a schematic of yet another conventional non-volatile storage system 300. The non-volatile storage system 300 includes a host system interface 301 for communication with a host system (not shown), a cyclic redundancy check (CRC) block 302, a multiplexer/de-multiplexer 303, a volatile memory controller 304, a volatile memory array 305, an address translation unit 307, a data processing unit 306 that may include different data processing blocks such as a security block, a compression engine, one or more error-correction units, data scrambler block, etc., a non-volatile memory controller 308, a non-volatile memory array 309, and an internal processing unit(s) 310. All of these elements collectively form the conventional non-volatile storage system 300.

Figure 4:
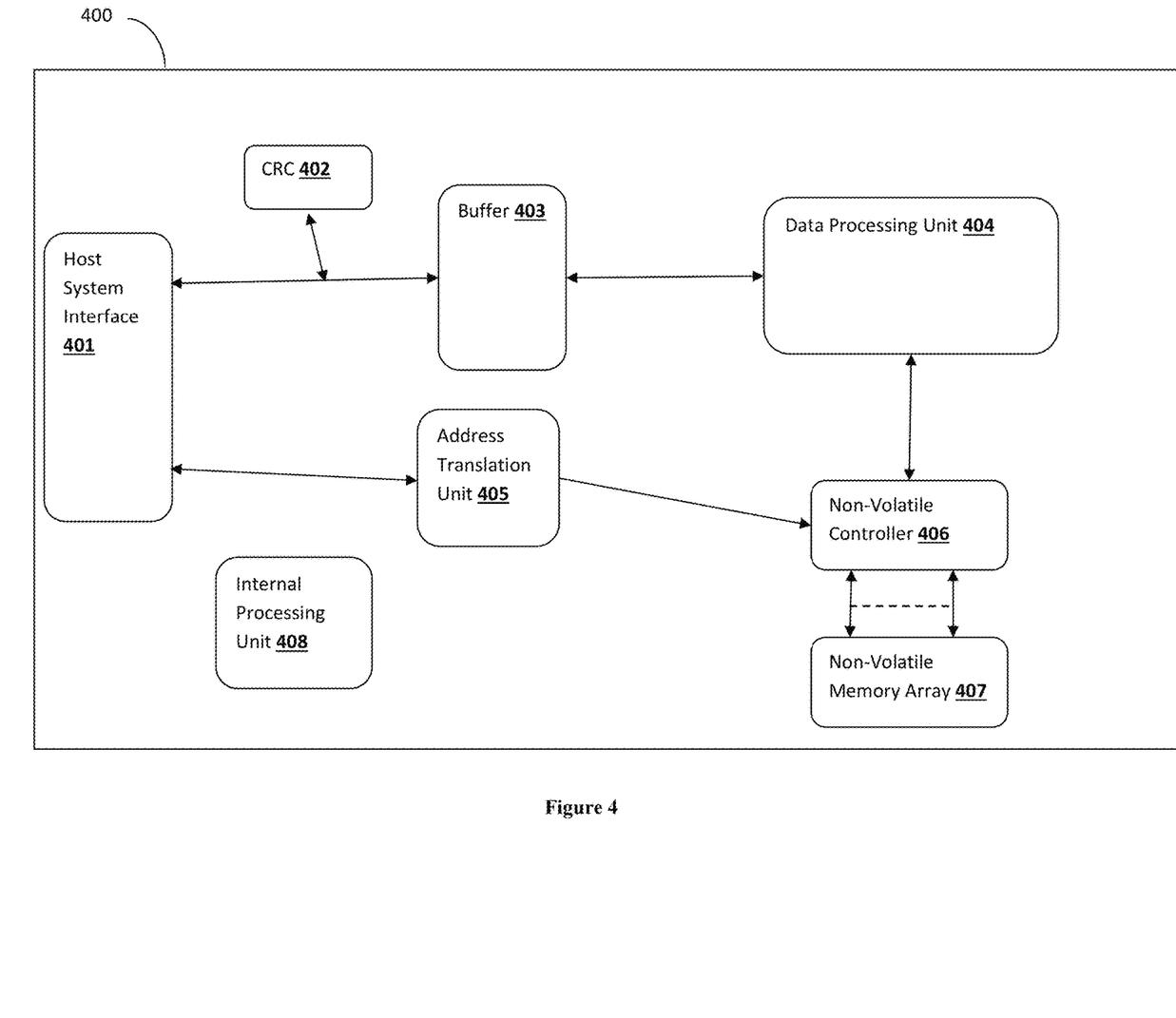
FIG. 4 is a schematic of yet another conventional non-volatile storage system.

FIG. 4 shows a schematic of yet another conventional non-volatile storage system 400. The non-volatile storage system 400 includes a host system interface 401, a cyclic redundancy check (CRC) block 402, a buffer 403, an address translation unit 405, a data processing unit 404 that may include different data processing blocks such as a security block, a compression engine, one or more error-correction units, data scrambler block, etc., a non-volatile memory controller 406, a non-volatile memory array 407, and an internal processing unit 408. All of these elements collectively form the conventional non-volatile storage system 400. The non-volatile memory array 407 can include one or more non-volatile memories (e.g., flash drives, solid-state drives, phase change memories, NAND flash, etc.).

It is common for non-volatile storage systems to process incoming data from the host system before storing the processed data into the non-volatile memory. The processing may involve compression, encryption, and others, for reducing the size of the data (to increase the utility size of the non-volatile memory) and increase security. As shown in the above examples, these conventional non-volatile storage systems 100, 200, 300, and 400 all have data processing units for performing the data processing. Furthermore, the data processing units are disposed in the data path between the volatile memory arrays and the non-volatile memory arrays such that any data being transmitted from the volatile memory arrays to the non-volatile memory arrays will be processed by the data processing units.

As mentioned above, as the capacity of the non-volatile storage systems grow, the power consumption required for transferring all of the data that is temporarily stored in the volatile memory array of the non-volatile storage system to the non-volatile memory array also increased dramatically. The processing required to be done on the data (by passing the data through the data processing blocks) contributes to a majority of this power consumption. The large power consumption is acceptable during normal operation of the host system as the power supply of the host system should be sufficient for such data processing operation. However, in the event of a sudden, unscheduled power loss event (e.g., power outage, accidental disconnection of a main power supply, etc.), the non-volatile storage system has to rely on its own back-up power supply to perform such operations. As such, in order to reduce the need to have a large battery or super capacitor as back-up power supply for the non-volatile storage system, it has been conceived that a non-volatile storage system can include two different data paths for data to be transmitted from the volatile memory array to the non-volatile memory array of the non-volatile storage system, where a normal operating data path includes the data processing unit for use during normal operation and an emergency power loss data path that exclude the data processing unit for use during emergency power loss event.

Figure 5:
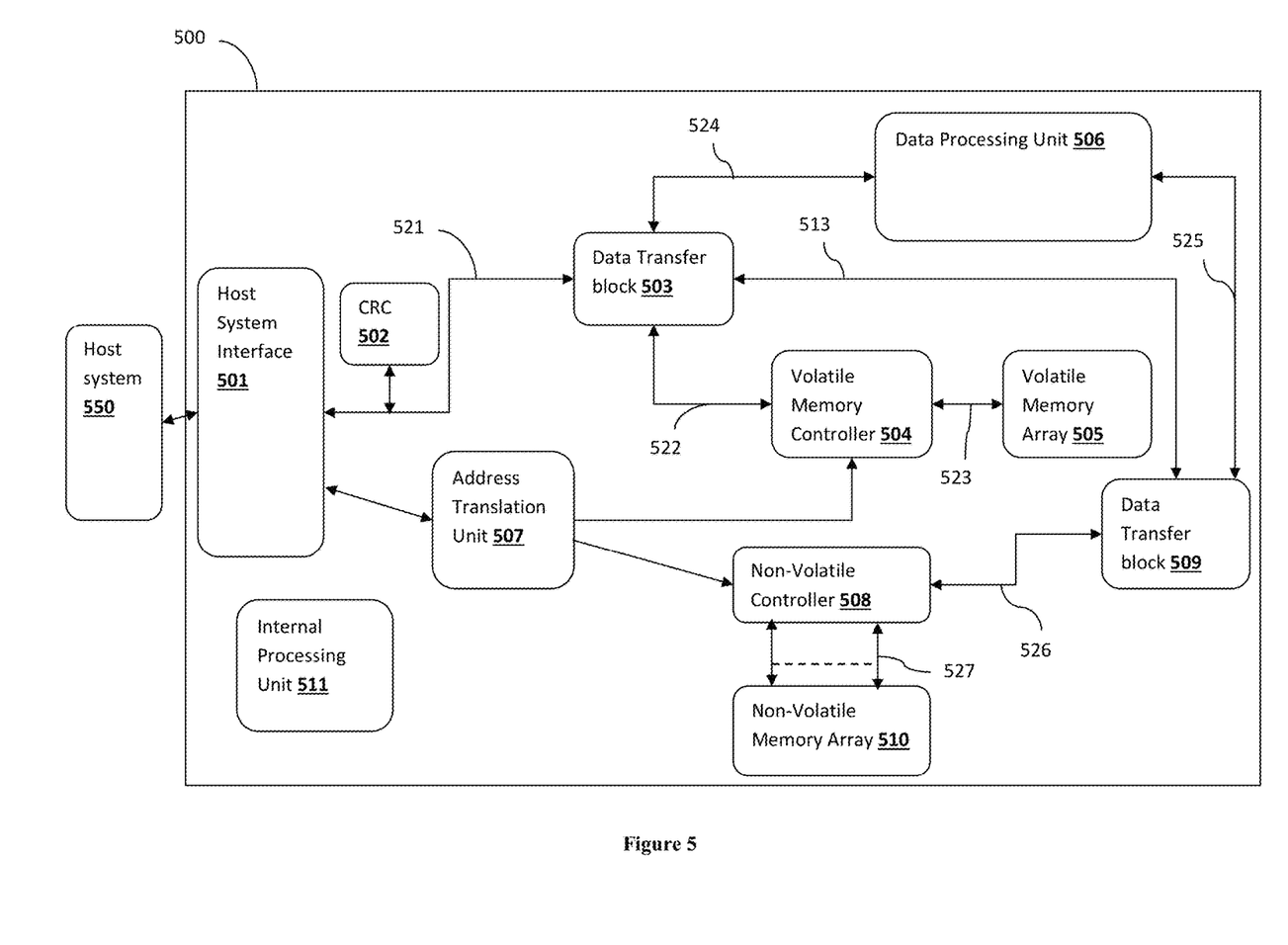
FIG. 5 is a schematic of a non-volatile storage system of some embodiments that is connected to a host system.

FIG. 5 illustrates a schematic of a non-volatile storage system 500 of some embodiments of the inventive subject matter. The non-volatile storage system 500 includes a host system interface 501, a cyclic redundancy check (CRC) block 502, a data transfer block 503, a volatile memory controller 504, a volatile memory array 505, an address translation unit 507, a data processing unit 506, a non-volatile memory controller 508, another data transfer block 509, a non-volatile memory array 510, and an internal processing unit 511.

In some embodiments, the host system interface 501 is a hardware connector that when coupled with the host system 550 (e.g., via a north/south bridge, etc.) can allow the non-volatile storage system 500 to communicate with (e.g., transmit data to and receive data from) the host system 550. For example, the non-volatile storage system 500 may receive commands from the host system 550 via the host system interface 501 to retrieve certain data from the non-volatile memory array 510 of the non-volatile storage system 500. The data retrieval command usually includes a memory address such that the non-volatile storage system 500 can retrieve the requested data from the proper location within the non-volatile memory array 510. The non-volatile storage system 500 may also receive commands from the host system 550 via the host system interface 501 to store certain data in the non-volatile memory array 510. The data storing command usually includes unprocessed data to be stored and a memory address so that the non-volatile storage system 500 may store the data in the proper location in the non-volatile memory array 510.

The data transfer blocks 503 and 509 are intermediate elements when data are being transmitted along the various data paths in the system. The data transfer blocks 503 and 509 can be implemented in many different ways, such as one or more buffer, one or more multiplexer and de-multiplexer, one or more FIFO, one or more LIFO, one or more cache to properly buffer, cache, hold, stage, and pass through as an intermediate staging of volatile data of non-volatile Storage unit during unpredictable, or unscheduled power loss event prior to committing the host data into non-volatile memory units during storage cycle or retrival of data from non-volatile memory units into host system during fetch cycles In some embodiments, the data processing unit 506 includes multiple hardware blocks that perform different data processing functions on data. The data processing unit 506 of some embodiments may include one or more of a security block, a compression engine, an error-correction unit, and a data scrambler block. Each of the security block, the compression engine, the error-correction unit, and the data scrambler block may be a standalone hardware block that includes electronic components such as transistors, gates, etc. for performing a specific data processing function. For example, the security block can be configured to perform data encryption function (e.g., Blowfish, AES, etc.), the compression engine can be configure do perform data compression (e.g., LZRW3 lossless, Lempel-Ziv based algorithms, etc.), the error-correction unit can be configured to perform error correction functions on the data (e.g., Reed-Solomon, Low-Density Parity Check (LDPC), Bose Chauddhuri (BCH), Viterbi, checksums, etc.), and the data scrambler block can be configured to perform data scrambling functions on the data.

The internal processing unit 511 of some embodiments can be a processor (or a processing core) such as an Intel® Core i7, an AMD Athlon processor, etc. or any other types of programmable chip that can be programmed (by executing a software program) to perform a set of functions for the non-volatile storage system 500. In some embodiments, the internal processing unit 511 is programmed to direct data to pass through the non-volatile storage system 500 in different paths under different conditions.

In some embodiments, when the non-volatile storage system 500 is initialized, the internal processing unit 511 is programmed to allocate a section within the non-volatile memory array and designate the allocated section as a data recovery block. In some of these embodiments, the internal processing unit 511 is programmed to allocate a memory size for the data recovery block that is at least the same size as the volatile memory array. For example, if the volatile memory array 505 has a size of 1 Gigabyte (GB), the internal processing unit 511 is programmed to allocate 1 GB of memory section for the data recovery block. Additionally, the internal processing unit 511 is programmed to store a previous power loss flag (e.g., a bit, a byte, etc.) in the non-volatile memory array 510. The previous power loss flag indicates whether there an unscheduled power loss (e.g., power outage) event immediately before a power-up of the host system 550. The internal processing unit 511 is programmed to initially set the flag as negative (e.g., 0).

When the non-volatile storage system 500 receives a save data command from the host system via the host system interface 550, the internal processing unit 511 of some embodiments is programmed to retrieve the data (referred herein as unprocessed data) to be saved from a volatile memory unit (e.g., a DRAM) of the host system via the host system interface 550, and save the unprocessed data temporarily in the volatile memory array 505 via data paths 521, 522, and 523 before committing the data to the non-volatile memory array 510.

In this instance, the volatile memory array 505 acts as a buffer to hold the unprocessed data temporarily before it is stored in the non-volatile memory array 510. The internal processing unit 511 is programmed to transfer data from the volatile memory array 505 to the non-volatile memory array one at a time. Under normal operating conditions (e.g., power supply for the non-volatile storage system 500 is stable), the internal processing unit 511 is programmed to send the unprocessed data down the paths 523, 522, and 524 to be processed by the data processing unit 506. As mentioned above, the data processing unit 506 includes one or more data processing blocks (e.g., security block, compression engine, error-correction unit, data scrambler, etc.) that are configured to processed the unprocessed data to generate processed data before sending the processed data down the paths 525, 526, and 527 to be store in the non-volatile memory array 510. The paths 523, 522, 524, 525, 526, and 527 collectively are referred to as the normal operating data path. In some of these embodiments, the internal processing unit 511 is programmed to direct the processed data to be stored in an area of the non-volatile memory array 510 outside of the data recovery block.

It is conceived that due to the latency caused by processing the unprocessed data from the data processing unit 506, unprocessed data can be built up in the volatile memory array 505 over time.

When the internal processing unit 511 detects an emergency power loss event (e.g., power outage of the host system, etc.), in order to prevent loss of data that is stored in the volatile memory array 505, the internal processing unit 511 is programmed save the data stored in the volatile memory array 505 in the non-volatile memory array 510. However, instead of sending the unprocessed data down the path of 524 to be processed by the data processing unit 506 before saving the data in the non-volatile memory array 510 (which takes more time and power), the internal processing unit 511 is programmed to send the unprocessed data down the paths of 523, 522, 513, 526, and 527 to the non-volatile memory array 510. The paths 523, 522, 513, 526, and 527 collectively are referred to as the emergency power loss data path. Essentially, the internal processing unit 511 is programmed to direct the unprocessed data to bypass the data processing unit 506 and be transmitted directly to the non-volatile memory array 510 without going through the numerous data processes.

In some of these embodiments, the internal processing unit 511 is programmed to direct the unprocessed data to the data recovery block that was previously allocated in the non-volatile memory array 510. The internal processing unit 511 is also programmed to flip the previous power loss flag in the non-volatile memory array 510 to positive (e.g., 1).

When the internal processing unit 511 detects that the host system is powered up, before performing any normal operations for the host system 550, the internal processing unit 511 is programmed to check the previous power loss flag stored in the non-volatile memory array 510. If the previous power loss flag is negative (e.g., 0), the internal process unit 511 is programmed to revert to the normal operations for the host system 550. On the other hand, if the previous power loss flag is positive (e.g., 1), the internal processing unit 511 is programmed to perform a set of data recovery functions before reverting back to normal operations for the host system 550.

As part of the data recovery functions, the internal processing unit 511 is programmed to retrieve the unprocessed data that is stored in the data recovery block of the non-volatile memory array and send the unprocessed data down the paths of 527, 526, 513, 522, and 523 (i.e., the emergency power loss data path) to the volatile memory array 505. This should restore the non-volatile storage system 500 to a state immediately before the power failure event. The internal processing unit 511 is then programmed to send the unprocessed data down the normal operating path—first, paths 523, 522, and 524 to the data process unit 506 to be processed by the data process unit 506 to generate processed data, and then via paths 525, 526, and 527 to be stored in the non-volatile memory array 510. In some of these embodiments, the internal processing unit 511 is programmed to direct the processed data to be stored in an area of the non-volatile memory array 510 outside of the data recovery block.

The internal processing unit 511 is the programmed to erase the data in the data recovery block of the non-volatile memory array 510, and flip the previous power loss flag in the non-volatile memory array 510 to negative (e.g., 0). The internal processing unit 511 then can revert back to the normal operations for the host system 550.

In some embodiments, the elements within the non-volatile storage system 500 except the host system interface 501, the non-volatile controller 508, and the non-volatile memory array 510, are collectively referred to as a controller unit for the non-volatile storage system 500.

Figure 6:
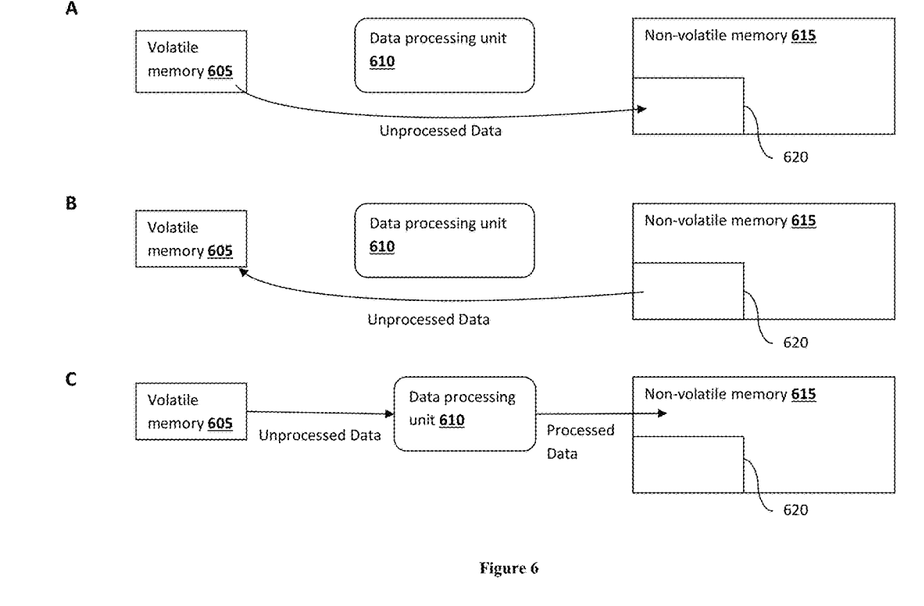
FIG. 6 illustrates the data flow during an emergency power failure event.

FIG. 6 illustrate the flow of data between a volatile memory 605 and a non-volatile memory within a non-volatile storage system during a power failure event and a subsequent power up of an associated host system. Specifically, FIG. 6 shows the flow of data in three stages: stage A, stage B, and stage C. Stage A of FIG. 6 shows a volatile memory 605, a data processing unit 610, and a non-volatile memory 615 of a non-volatile storage system. As shown, the non-volatile memory includes a data recovery block designated to store data that is being recovered during a power failure event. In stage A, the non-volatile storage system just detected a power failure event (e.g., an unscheduled power outage, etc.). Thus, the controller of the non-volatile storage system directs the entire content (unprocessed data) stored in the volatile memory 605 of the non-volatile storage system to the data recovery block 620 of the non-volatile memory 615 in a path the bypass the data processing unit 610.

In stage B, the non-volatile storage system detects a power up event of the host system, and determines that the previous power loss flag is positive. Thus, the controller of the non-volatile storage system retrieves the unprocessed data from the data recovery block 620 and temporarily stores the unprocessed data in the volatile memory 605 before performing any normal operations for the host system.

In stage C, the controller of the non-volatile storage system sends the unprocessed data in the volatile memory 605 to the non-volatile memory 615 via a path that includes the data processing unit 610. As the unprocessed data passes through the data processing unit 610, the data processing unit 610 performs one or more processing on the data to generate processed data. As shown, the controller stores the processed data in a section of the non-volatile memory 615 outside of the data recovery block 620. The controller of some embodiments also erases the data in the data recovery block 620 and flips the previous power loss flag back to negative.

Figure 7:
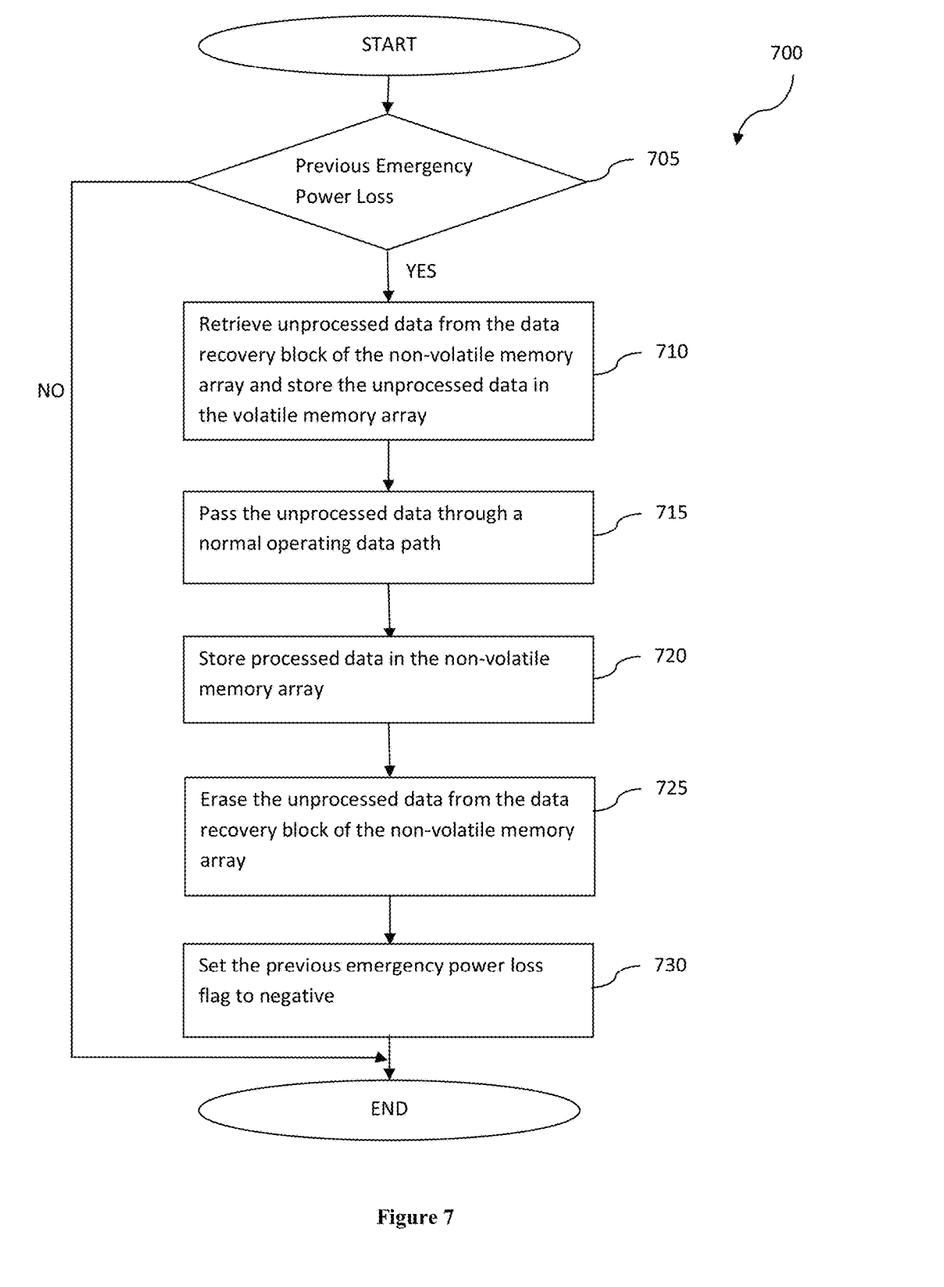
FIG. 7 illustrates a process of recovering data after an emergency power loss.

FIG. 7 illustrates a process 700 performed by the non-volatile storage system (specifically the controller unit of the non-volatile storage system) when the non-volatile storage system detects a power-up event (e.g., the computer being turned on) of the associated host system. The process 700 begins by determining (at step 705) whether there is a previous emergency power loss immediately prior to the power-up event. The controller of some embodiments can make this determination by checking a previous power loss flag stored in the non-volatile memory of the non-volatile storage system.

If it is determined that there is no previous emergency power loss, the process 700 ends. However, if it is determined that there is a previous emergency power loss, the process 700 retrieves (at step 710) the unprocessed data from the data recovery block of the non-volatile memory array and temporarily stores the retrieved unprocessed data in the volatile memory array. The process 700 then passes (at step 715) the unprocessed data from the volatile memory array to the non-volatile memory array via a normal operating data path. The normal operating data path includes one or more data processing block that processes the unprocessed data to generate processed data. After generating the processed data, the process 700 stores (at step 720) the processed data in the non-volatile memory array. In some embodiments, the process 700 stores the processed data in an area of the non-volatile memory array outside of the data recovery block.

The process 700 then erases (at step 725) the unprocessed data from the data recovery block of the non-volatile memory array and sets (at step 730) the previous emergency power loss flag to negative.

Figure 8:
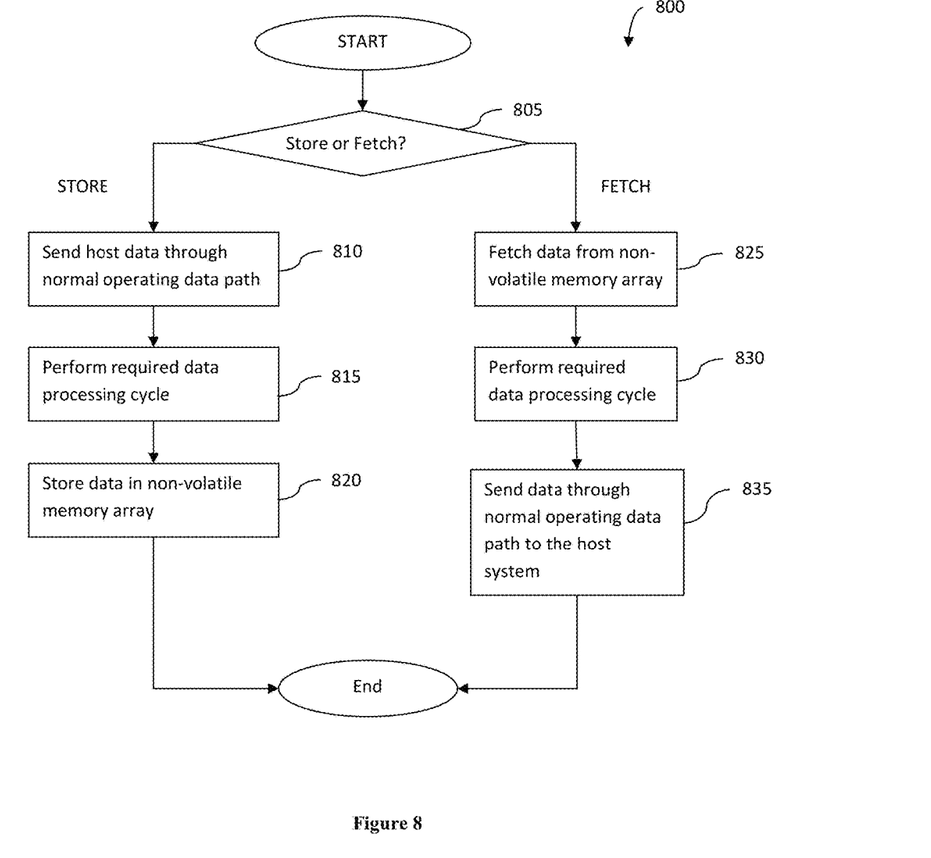
FIG. 8 illustrates a process of normal data operations performed by a non-volatile storage system.

FIG. 8 illustrate a process 800 performed by the non-volatile storage system (specifically the controller unit of the non-volatile storage system) under normal operating condition. The process 800 begins by receiving a command from an associated host system and determining (at step 805) whether the command is a store command or a fetch command. If it is determined that the command is a store command, the process 800 sends (at step 810) data to be stored (unprocessed data) down a normal operating data path that includes one or more data processing blocks.

The process 800 then performs (at step 815) the required data processing cycle such as compression, error correction, security, and data scrambling functions on the unprocessed data to generate processed data. After generating the processed data, the process 800 stores (at step 820) the processed data in the non-volatile memory array.

If on the other hand at step 805, it is determined that the command is a data fetch command, the process 800 fetches (at step 825) the processed data that is stored in the non-volatile memory array according to an address provided in the fetch command. The process 800 then performs (at step 830) the required data processing to the processed data to generate reverted data. The processing done at this step should be the reverse of the processing being done at step 815. For example, if part of step 815, the process 800 encrypts the unprocessed data using an encryption algorithm, the process 800 would performs a decryption process of the data using a decryption algorithm associated with the encryption algorithm. The reverted data should be identical to the unprocessed data received from the host system before the process stores the data in the non-volatile memory array. Finally, the process 800 sends (at step 835) the reverted data back to the host system.

Figure 9:
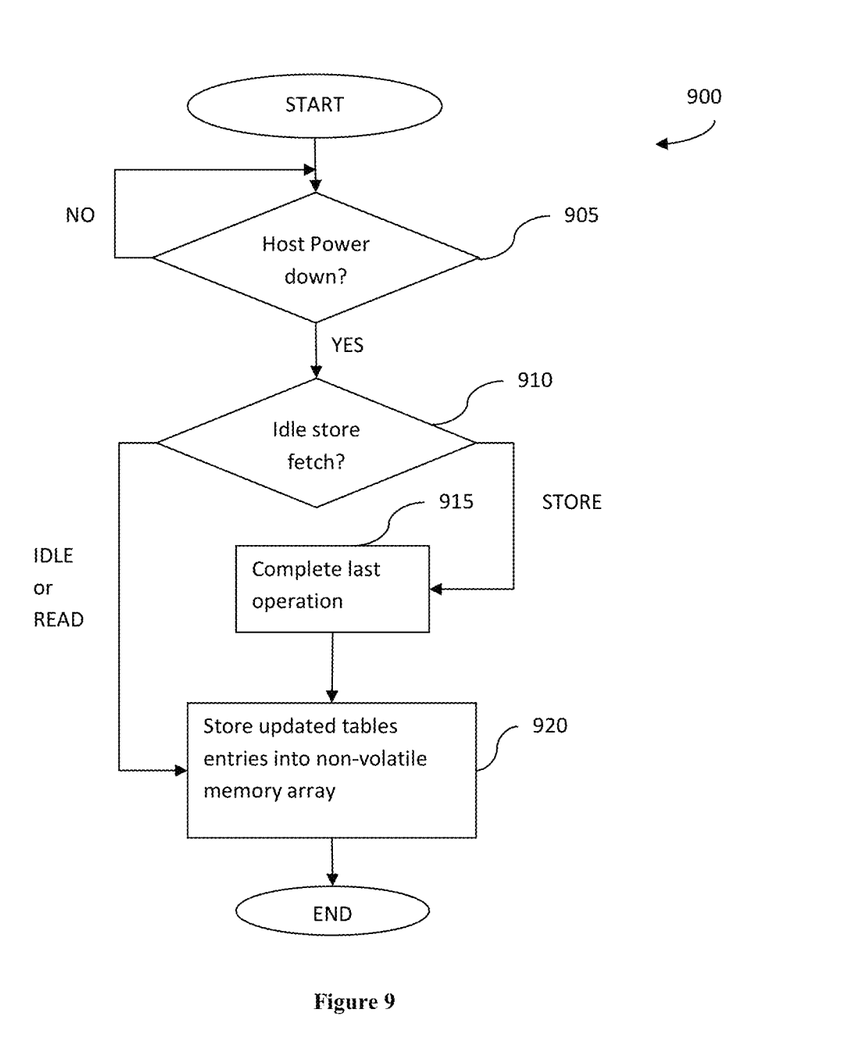
FIG. 9 illustrates a process of data operation during a scheduled power down event.

FIG. 9 illustrates a process 900 performed by the non-volatile storage system (specifically the controller unit of the non-volatile storage system) during a scheduled, regular power-down of a host system associated with the non-volatile storage system. The process 900 begins by determining (at step 905) whether there is a power-down event of the host system (e.g., user turning off the host system, etc.). If there is no power-down event, the process 900 will periodically checks to see if there is a power-down event of the host system (e.g., every second, every 5 seconds, etc.). If it is determined that there is a power-down event, the process 900 determines (at step 910) if there is a pending command that has not been executed yet. If there is a pending data store command, the process 900 completes (at step 915) the operation associated with this store command (see process 800 of FIG. 8), and stores (at step 920) updated table entries into the non-volatile memory array.

If at step 910, it is determined that the system is either idle or there is a pending read command, the process 900 goes directly to step 920 to store updated table entries into the non-volatile memory array and ends.

Figure 10:
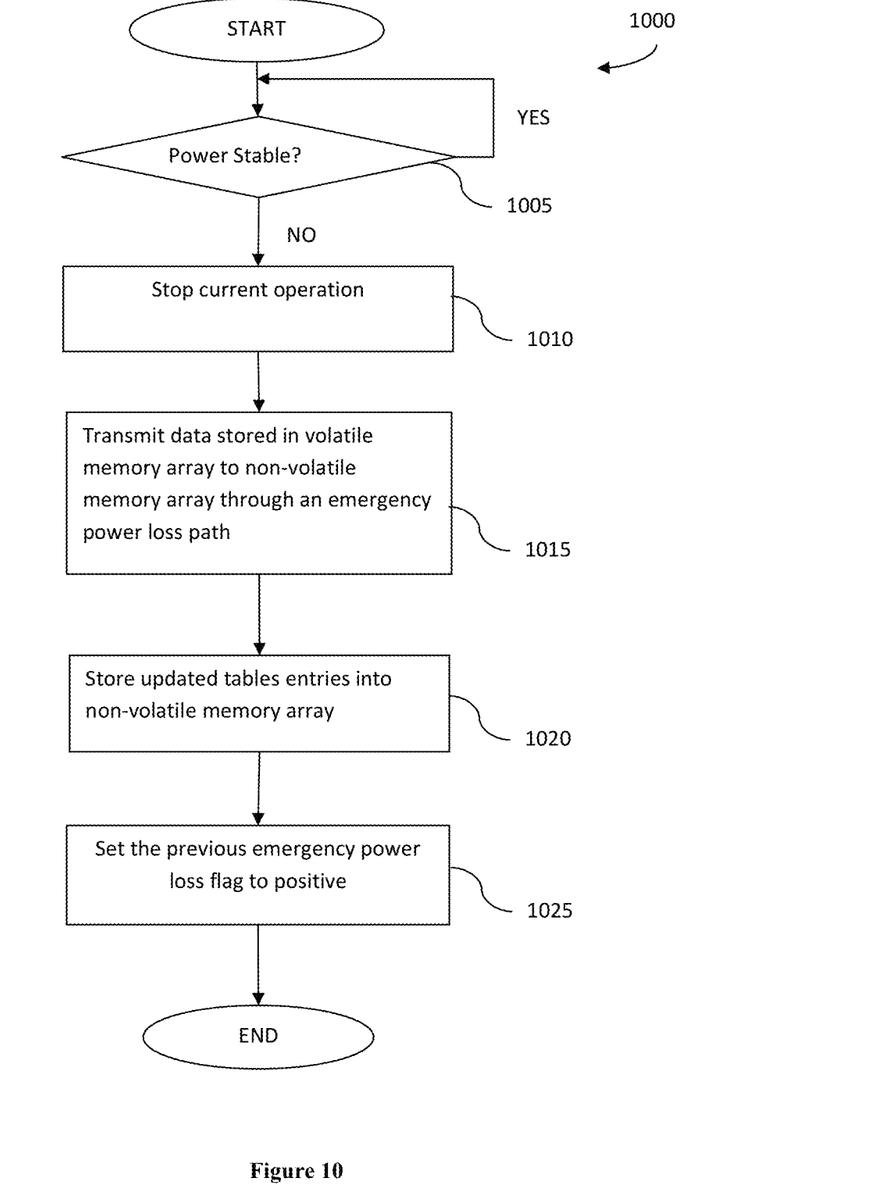
FIG. 10 illustrates a process of recovering data after detecting an emergency power loss event.

FIG. 10 illustrates a process 1000 performed by the non-volatile storage system (specifically the controller unit of the non-volatile storage system) when the host system associated with the non-volatile storage system experiences an emergency power failure event. The process 1000 begins with determining (at step 1005) whether the power received at the non-volatile storage system is stable. If it is determined that the power is stable, the process 1000 continues to periodically check to see if the power is stable.

If at step 1005, it is determined that the power is unstable, the process 1000 stops (at step 1010) the current operation immediately. The process 1000 then transmits (at step 1015) the entire content (e.g., unprocessed data) stored in the volatile memory array to the non-volatile memory array via an emergency power loss path that does not include the normal processing of the data. In some embodiments, the process 1000 stores the unprocessed data directly in the data recovery block of the non-volatile memory array. The process 100 then stores (at step 1020) updated table entries into the non-volatile memory array, and sets (at step 1025) the previous emergency power loss flag to positive.

Figure 11:
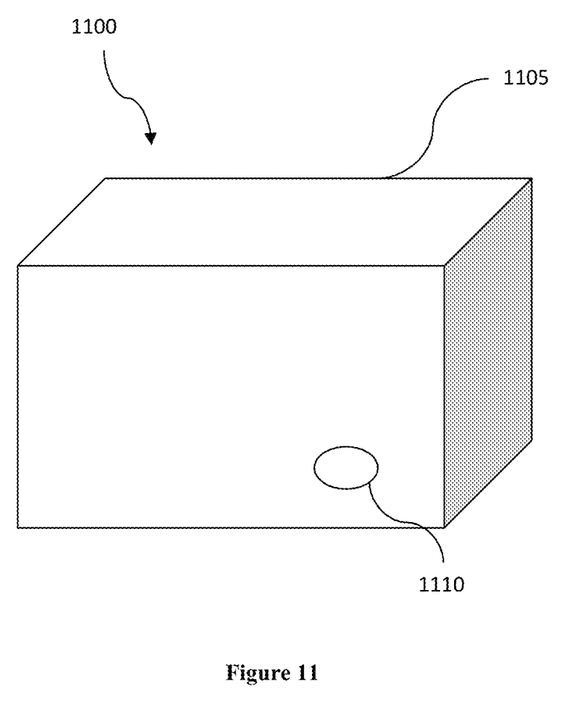
FIG. 11 shows an exemplary non-volatile storage unit of some embodiments.

In some embodiments, a non-volatile storage unit is provided. FIG. 11 illustrates an example non-volatile storage unit 1100. The non-volatile storage unit 1100 includes a housing 1105 that encloses the elements of the non-volatile storage system 500 of FIG. 5. In some of these embodiments, the housing exposed the host system interface 1110. The host system interface 1110 can be implemented as a electronic connector that is configured to connect with the host system 500.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method of providing quick data recovery in a storage system communicatively coupled with a host system, the storage system comprising a controller, a volatile memory unit, a non-volatile memory unit, and a series of data processing blocks, the method comprising:
   providing a normal operating data path from the volatile memory unit to the non-volatile memory unit via the controller, wherein the normal operating data path comprises the series of data processing blocks;
   providing an emergency power toss data path from the volatile memory unit to the non-volatile memory unit via the controller, wherein the emergency power loss data path does not comprise the series of data processing blocks;
   temporarily storing unprocessed data in the volatile memory unit;
   upon detecting a power failure event, transmitting, by the controller, the unprocessed data from the volatile memory unit to the non-volatile memory unit via the emergency power loss data path;
   upon detecting a power-up event, performing, by the controller, the following steps:
      retrieving the unprocessed data from the data recovery block of the non-volatile memory unit and storing the unprocessed data in the volatile memory unit; and
      passing the unprocessed data via the normal operating data path.

2. The method of claim 1, further comprising allocating, by the controller, a data recovery block in the non-volatile memory unit.

3. The method of claim 2, wherein the volatile memory unit has a size, wherein the step of allocating the data recovery block comprises allocating a block of memory having at least a size that is equal to the size of the volatile memory unit and designating the block of memory as the data recovery block.

4. The method of claim 2, wherein transmitting the data to non-volatile memory unit via the emergency power loss data path comprises directly transmitting the unprocessed data from the volatile memory unit to the non-volatile memory unit without passing through the series of data processing blocks.

5. The method of claim 4, wherein transmitting the data to non-volatile memory unit via the emergency power loss data path further comprises storing the unprocessed data in the data recovery block of the non-volatile memory unit.

6. The method of claim 2, wherein passing the unprocessed data through the normal operating data path comprises passing the unprocessed data through the series of data processing blocks to generate processed data.

7. The method of claim 6, wherein passing the unprocessed data through the normal operating data path further comprises storing the processed data in an area of the non-volatile memory unit outside of the data recovery block.

8. The method of claim 1, wherein the series of data processing blocks comprises at least one of a security block, a compression and decompression block, an error correction circuitry block, and a scrambler and de-scrambler blocks.

9. The method of claim 1, further comprising erasing the unprocessed data from the data recovery block of the non-volatile memory unit after retrieving the unprocessed data upon detecting the power-up event.

10. The method of claim 1, further comprising receiving new data from the host system after the unprocessed data is passed through the normal operating data path upon detecting the power-up event.

11. A storage system communicatively coupled with a host system, the storage system comprising:
   a volatile memory unit configured to temporarily store unprocessed data;
   a non-volatile memory unit;
   a series of data processing blocks;
   a controller communicatively coupled with the volatile memory unit, the non-volatile memory unit, and the series of data processing blocks, and configured to:
      upon detecting a power failure event, transmit the unprocessed data from the volatile memory unit to the non-volatile memory unit via an emergency power loss data path in the controller, wherein the emergency power loss data path does not comprise the series of data processing blocks;
      upon detecting a power-up event, perform a series of power-up steps comprising:
         retrieving the unprocessed data from the data recovery block of the non-volatile memory unit and storing the unprocessed data in the volatile memory unit; and
         passing the unprocessed data from the volatile memory unit to the non-volatile memory unit via a normal operating data path in the controller, wherein the normal operating data path comprises the series of data processing blocks.

12. The storage system of claim 11, wherein the volatile memory unit has a size, wherein the controller is further configured to allocate a block of memory having at least a size that is equal to the size of the volatile memory unit and designate the allocated block of memory as a data recovery block.

13. The storage system of claim 12, wherein the controller is configured to transmit the data to non-volatile memory unit via the emergency power loss data path by directly transmitting the unprocessed data from the volatile memory unit to the non-volatile memory unit without passing through the series of data processing blocks.

14. The storage system of claim 13, wherein the controller is further configured to store the unprocessed data in the data recovery block of the non-volatile memory unit.

15. The storage system of claim 12, wherein the controller is configured to pass the unprocessed data through the normal operating data path by passing the unprocessed data through the series of data processing blocks to generate processed data.

16. The storage system of claim 15, wherein the controller is further configured to store the processed data in an area of the non-volatile memory unit outside of the data recovery block.

17. The storage system of claim 11, wherein the series of data processing blocks comprises at least one of a security block, a compression and decompression block, an error correction circuitry block, and a scrambler and de-scrambler blocks.

18. The storage system of claim 11, wherein the controller is further configured to erase the unprocessed data from the data recovery block of the non-volatile memory unit after retrieving the unprocessed data upon detecting the power-up event.

19. The storage system of claim 11, wherein the volatile memory unit comprises an array of volatile memories, and wherein the non-volatile memory unit comprises an array of non-volatile memories.

20. A non-volatile data storage unit configured to couple with a host system, and comprising the storage system according to claim 11.

* * * * *